(12) United States Patent
Noh et al.

(10) Patent No.: US 10,263,060 B2
(45) Date of Patent: Apr. 16, 2019

(54) HYBRID THIN FILM TRANSISTOR AND ORGANIC LIGHT EMITTING DISPLAY DEVICE USING THE SAME

(71) Applicant: LG DISPLAY CO., LTD., Seoul (KR)

(72) Inventors: SoYoung Noh, Goyang-si (KR); JinChae Jeon, Paju-si (KR); HyunSoo Shin, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/652,955

(22) Filed: Jul. 18, 2017

(65) Prior Publication Data

US 2018/0033849 A1 Feb. 1, 2018

(30) Foreign Application Priority Data

Jul. 27, 2016 (KR) .................. 10-2016-0095249

(51) Int. Cl.

| H01L 27/32 | (2006.01) |
|---|---|
| H01L 51/00 | (2006.01) |
| H01L 29/786 | (2006.01) |
| H01L 27/12 | (2006.01) |
| H01L 29/423 | (2006.01) |

(52) U.S. Cl.
CPC ...... *H01L 27/3272* (2013.01); *H01L 27/3223* (2013.01); *H01L 27/3248* (2013.01); *H01L 27/3258* (2013.01); *H01L 27/3262* (2013.01); *H01L 27/3265* (2013.01); *H01L 27/1225* (2013.01); *H01L 27/1251* (2013.01); *H01L 29/42384* (2013.01); *H01L 29/7869* (2013.01); *H01L 29/78633* (2013.01); *H01L 29/78675* (2013.01); *H01L 51/0097* (2013.01); *H01L 2227/323* (2013.01); *H01L 2251/5338* (2013.01)

(58) Field of Classification Search
CPC .................. H01L 27/3272; H01L 27/3248
USPC ............................................. 257/49
See application file for complete search history.

(56) References Cited

U.S. PATENT DOCUMENTS

| 2015/0243685 A1* | 8/2015 | Lee ............... H01L 29/7869 257/43 |
|---|---|---|
| 2016/0064465 A1* | 3/2016 | Oh ............... H01L 27/3262 257/43 |
| 2016/0190346 A1* | 6/2016 | Kawata ........ H01L 21/67207 257/43 |
| 2016/0372497 A1* | 12/2016 | Lee ............... H01L 27/1255 |

* cited by examiner

*Primary Examiner* — Igwe U Anya
(74) *Attorney, Agent, or Firm* — Birch, Stewart, Kolasch & Birch, LLP

(57) ABSTRACT

Different types of thin film transistors are disposed on the same flexible substrate and an organic light emitting display using the same includes a display area and a non-display area; a first buffer layer over an entire surface of the flexible substrate; a driving transistor on the buffer layer in the display area, the driving transistor including a polycrystalline silicon (LTPS) layer, a first gate electrode, a first source electrode, and a first drain electrode; a capacitor electrode on the first source electrode of the driving transistor and forming a storage capacitor together with the first source electrode; a switching transistor in the display area to be spaced apart from the driving transistor; and a dummy electrode on the switching transistor, the dummy electrode formed of the same material as the capacitor electrode, and disposed on the same plane as the capacitor.

23 Claims, 6 Drawing Sheets

HYBRID THIN FILM TRANSISTOR AND ORGANIC LIGHT EMITTING DISPLAY DEVICE USING THE SAME

CROSS-REFERENCE TO RELATED APPLICATIONS

This application claims the priority of Korean Patent Application No. 10-2016-0095249 filed on Jul. 27, 2016, in the Korean Intellectual Property Office, the disclosure of which is incorporated herein by reference into the present application.

BACKGROUND

Field

The present disclosure relates to a hybrid thin film transistor in which different types of thin film transistors are disposed on the same flexible substrate and an organic light emitting display device using the same.

Description of the Related Art

The demand for display devices is increasing. As such, thin, light, and high resolution flat panel display devices (FPD) have replaced bulky cathode ray tube (CRT) displays.

The flat panel display device can be a light crystal display device (LCD), an organic light emitting display device (OLED), or an electrophoretic display device (ED).

The liquid crystal display device, the organic light emitting display device, and the electrophoretic display device which are actively driven each include a thin film transistor substrate in which thin film transistors allocated in a pixel area disposed in a matrix manner are disposed.

The liquid crystal display device (LCD) displays an image by adjusting light transmittance of liquid crystal using an electric field applied thereto. The organic light emitting display device displays an image via organic light emitting diodes in pixels arranged in a matrix manner.

The organic light emitting diode is a self-light emitting element which emits light by itself and is advantageous in terms of a high response speed, high luminous efficiency, high luminance, and a wide viewing angle.

Specifically, the organic light emitting display device (OLED) which uses a characteristic of an organic light emitting diode with excellent energy efficiency is broadly classified into a passive matrix type organic light emitting display (PMOLED) and an active matrix type organic light emitting display device (AMOLED).

In the organic light emitting display device, pixels including organic light emitting diodes and pixel circuits are disposed in a matrix form and luminance of an image is adjusted by pixels which are driven in accordance with a gray scale of video data.

Further, the organic light emitting display device includes a plurality of gate electrode lines, a plurality of data lines, a plurality of power lines, and a plurality of pixels which is connected to the above-mentioned lines to be disposed in a matrix form. Each pixel includes an organic light emitting diode configured by an organic light emitting layer between an anode and a cathode and a pixel circuit which independently drives the organic light emitting diode. The pixel circuit is mainly configured by a switching transistor which transmits a data signal, a driving transistor which drives the organic light emitting diode in accordance with the data signal, and one capacitor which maintains a data voltage. The switching transistor charges the data voltage into the capacitor in response to a scan pulse. The driving transistor adjusts a light emission amount of the organic light emitting diode by controlling a current amount supplied to the organic light emitting diode in accordance with the data voltage charged in the capacitor. Further, a turn-on time of the switching transistor may be shorter than that of the driving transistor. The turn-on time of the transistor is related to power consumption of the organic light emitting display device.

In accordance with the active development of personal electronic devices, display devices have been also developed as products which are superior in portability and wearability. As described above, in order to apply the display device to the portable or wearable device, a display device with low power consumption is required. However, technologies related to the display devices developed so far have limitations in realizing low power consumption.

Therefore, in recent years, in order to overcome the above-described problems, there is a necessity for a new pixel structure and a new organic light emitting display device which can drive the pixels with low power consumption.

SUMMARY

The inventors of the present disclosure invented a new pixel structure and a new organic light emitting display device which drive pixels of the organic light emitting display device with low power consumption as described above.

Therefore, an aspect of the present disclosure is to provide a new pixel structure and a new organic light emitting display device in which a driving transistor with a low temperature polycrystalline silicon (LTPS) layer as an active layer and a switching transistor with an oxide semiconductor layer as an active layer are formed.

Another aspect of the present disclosure is to provide a new pixel structure and a new organic light emitting display device in which a dummy metal pattern is formed on a switching transistor including an oxide semiconductor layer so that a switching transistor includes a dual gate electrode structure, thereby improving bias temperature stress and shielding external light which is incident onto an upper portion and a lower portion of a channel.

According to an aspect of the present disclosure, there is provided an organic light emitting display device that includes a flexible substrate including a display area and a non-display area, a first buffer layer is disposed over an entire surface of the flexible substrate, a driving transistor on the buffer layer in the display area, the driving transistor including a polycrystalline silicon (LTPS) layer, a first gate electrode, a first source electrode, and a first drain electrode, and a capacitor electrode on the first source electrode of the driving transistor, the capacitor electrode forming a storage capacitor together with the first source electrode.

The organic light emitting display device may further include a switching transistor in the display area to be spaced apart from the driving transistor, the switching transistor including an oxide semiconductor layer, a second gate electrode, a second source electrode, and a second drain electrode and a dummy electrode on the switching transistor, the dummy electrode formed of the same material as the capacitor electrode, and disposed on the same plane as the capacitor. The dummy electrode may be a third gate electrode of the switching transistor.

According to another aspect of the present disclosure, an organic light emitting display device includes a flexible substrate including a display area and a non-display area, a driving transistor in the display area, the driving transistor having a polycrystalline silicon (LTPS) layer as an active layer, and a switching transistor in the display area, the switching transistor disposed to be spaced apart from the driving transistor.

The switching transistor includes a first gate electrode, an oxide semiconductor layer overlaping the gate electrode, a source electrode in contact with one side of the oxide semiconductor layer, a drain electrode in contact with the other side of the oxide semiconductor layer; and a second gate electrode connected to the first gate electrode.

According to the organic light emitting display device of the present disclosure, the driving transistor with the polycrystalline silicon (LTPS) layer as an active layer and the switching transistor with an oxide semiconductor layer as an active layer are formed on the same substrate, so that a drawback of any one of the thin film transistors is compensated by the other thin film transistor. Specifically, the oxide semiconductor thin film transistor is provided so that it is possible to provide an organic light emitting display device suitable for a portable and/or wearable apparatus by realizing low-speed driving and reducing the power consumption. Further, a source electrode of the driving transistor and some electrodes of a dummy metal pattern form a storage capacitor Cst to increase the storage capacitor Cst of the display device with high resolution. Further, the dummy metal pattern is formed on the switching transistor to improve a bias temperature stress and shield external light which is incident onto an upper portion and a lower portion of a channel, using a switching transistor with a dual gate electrode structure.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
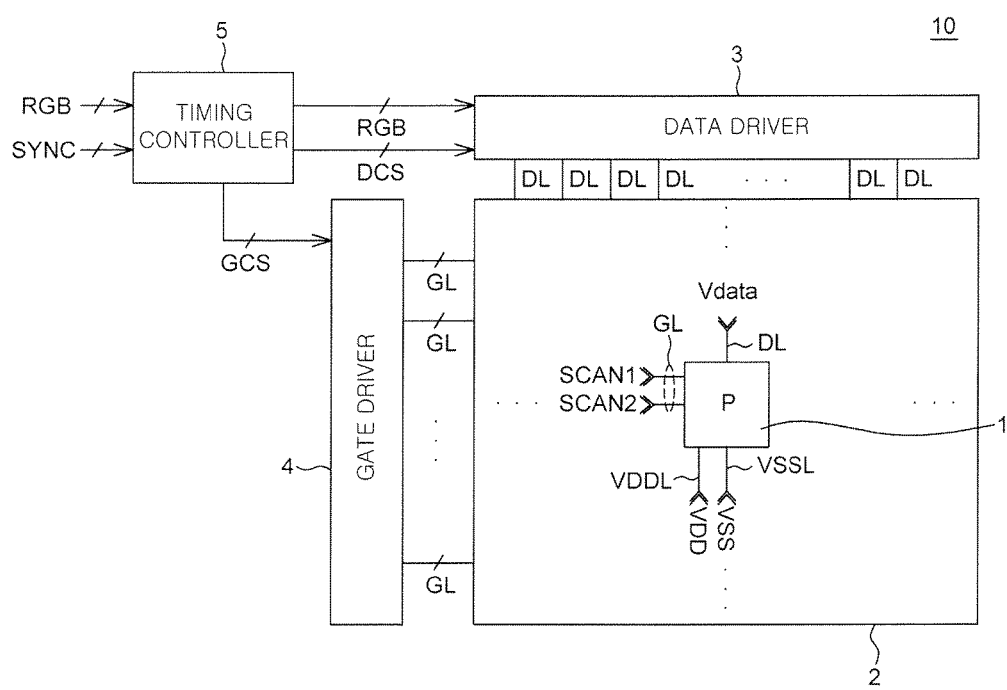
FIG. 1 is a diagram illustrating an organic light emitting display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to exemplary embodiment disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto.

Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated. When the position relation between two parts is described using the terms such as "on", "above", "below", and "next", one or more parts may be positioned between the two parts unless the terms are used with the term "immediately" or "directly" is not used.

When an element or layer is disposed "on" other element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely bonded to or combined with each other and can be interlocked and operated in technically various ways as understood by those skilled in the art, and the embodiments can be carried out independently of or in association with each other.

In the present disclosure, a transistor may be a P type transistor or an N type transistor. In the following exemplary embodiment, the transistor will be configured as an N type transistor for the convenience of description.

Hereinafter, an organic light emitting display device according to an exemplary embodiment of the present disclosure and a driving method thereof will be described in detail with reference to the accompanying drawings.

FIG. 1 is a diagram illustrating an organic light emitting display device according to an exemplary embodiment of the present disclosure. All the components of the organic light emitting display device according to all embodiments of the present disclosure are operatively coupled and configured.

An organic light emitting display device 10 illustrated in FIG. 1 includes a display panel 2 in which a plurality of gate lines GL and a plurality of data lines DL are disposed, whereby a pixel 1 is repeatedly arranged in a matrix layout, a gate driver 4 which transmits a driving signal of the pixel 1 to the plurality of gate lines GL, a data driver 3 which transmits a driving voltage of the pixel 1 to the plurality of data lines DL, and a timing controller 5 which aligns image data RGB input from the outside to supply the image data to the data driver 3 and outputs a gate control signal GCS and a data control signal DCS to control the gate driver 4 and the data driver 3.

According to the exemplary embodiment of the present disclosure, each pixel 1 among the plurality of pixels includes an organic light emitting diode (OLED) and a pixel driving circuit which includes a driving transistor supplying a driving current to the organic light emitting diode (OLED) to independently drive the organic light emitting diode (OLED). The pixel driving circuit may compensate an electrical characteristic deviation of the driving transistor such as a threshold voltage Vth and a mobility and reduce a luminance deviation between pixels 1 caused by a difference between currents supplied to the organic light emitting diode (OLED). The pixel 1 according to the exemplary embodiment of the present disclosure will be described in detail below with reference to FIGS. 2 to 4C.

The display panel 2 includes a plurality of gate lines GL and a plurality of data lines DL which intersect each other and a plurality of pixels 1 is disposed near the lines GL and DL. Each pixel 1 includes an organic light emitting diode OLED and a pixel driving circuit. The pixel 1 is connected to the gate line GL, the data line DL, a first voltage (VDD) supply line VDDL and a second voltage (VSS) supply line VSSL.

The gate driver 4 supplies a plurality of gate electrode signals to the plurality of gate lines GL in accordance with a plurality of gate control signals GCS supplied from the timing controller 5. The plurality of gate electrode signals includes first and second scan signals SCAN1 and SCAN 2 and these signals are supplied to the pixels 1 through the plurality of gate lines GL. The first voltage VDD is a high potential voltage and is relatively higher than a second voltage VSS which is a low potential voltage. The second voltage VSS may be a ground voltage.

The data driver 3 converts digital image data RGB input from the timing controller 5 into a data voltage Vdata using a reference gamma voltage in accordance with the plurality of data control signals DCS supplied from the timing controller 5. Further, the data driver 3 supplies the converted data voltage Vdata to the plurality of data lines DL. In the meantime, the data driver 3 outputs the data voltage Vdata during a programing period of each pixel 1.

The timing controller 5 aligns the image data RGB input from the outside in accordance with a size and a resolution of the display panel 2 to supply the image data to the data driver 3. The timing controller 5 generates a plurality of gate control signals GCS and a plurality of data control signals DCS using synchronization signals SYNC input from the outside, for example, a dot clock DCLK, a data enable signal DE, a horizontal synchronization signal Hsync, and a vertical synchronization signal Vsync. The plurality of generated gate control signals GCS and the plurality of generated data control signals DCS are supplied to the gate driver 4 and the data driver 3, respectively, to control the gate driver 4 and the data driver 3.

Figure 2:
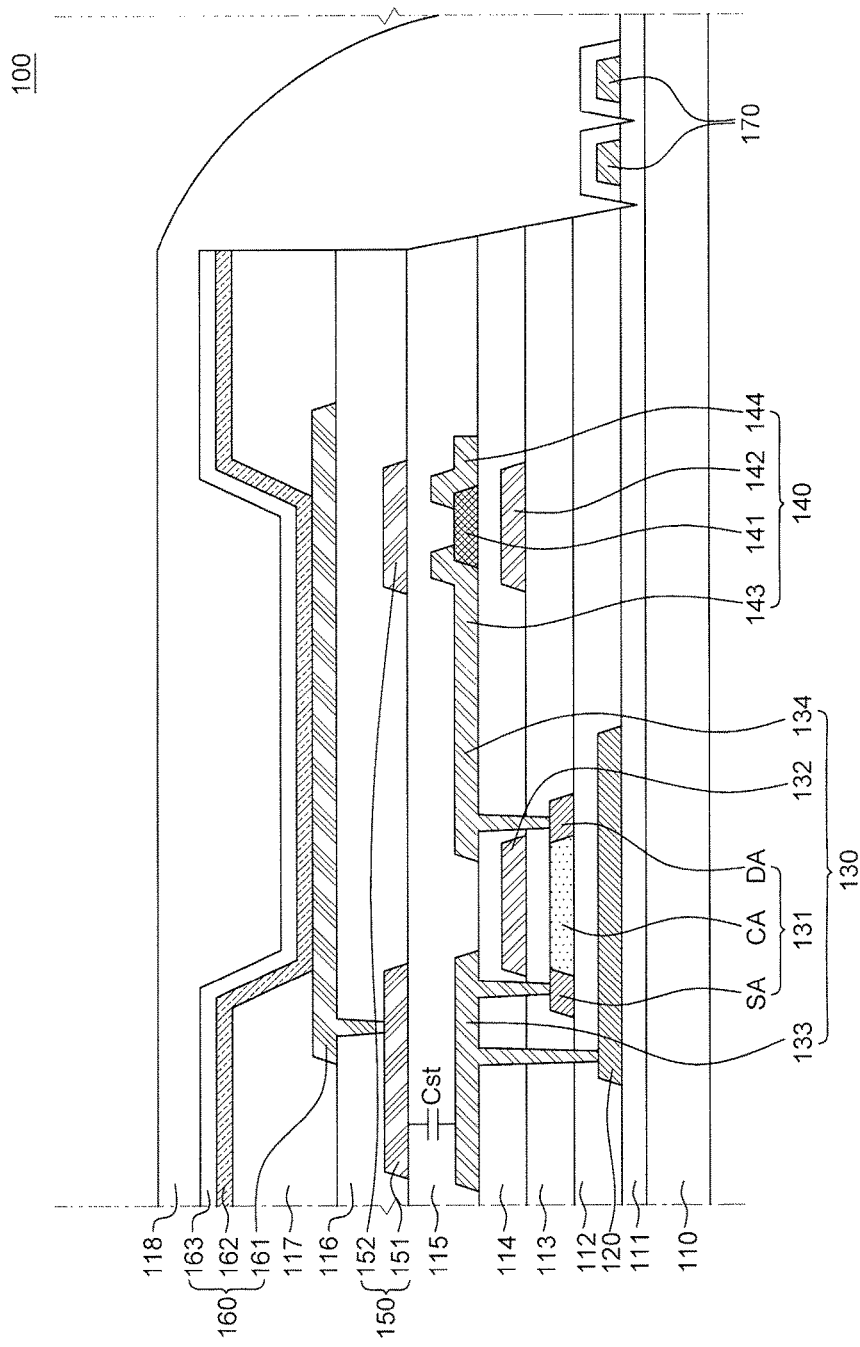
FIG. 2 is a cross-sectional view schematically illustrating a pixel structure illustrated in FIG. 1 according to an embodiment of the present disclosure.

Hereinafter, a pixel according to an exemplary embodiment of the present disclosure will be described in detail. FIG. 2 is a cross-sectional view schematically illustrating a pixel 1 structure illustrated in FIG. 1.

Each pixel 1 structure of an organic light emitting display device will be described with reference to FIG. 2. As illustrated in FIG. 2, the pixel 1 according to the exemplary embodiment of the present disclosure includes a lower substrate 110, a buffer layer 111, a bottom shield metal (BSM) 120, an active buffer layer 112, an LTPS thin film transistor 130, an oxide semiconductor thin film transistor 140, a dummy metal layer 150, an organic light emitting diode 160, and a signal line 170.

Further, the pixel 1 according to the exemplary embodiment of the present disclosure includes a gate insulating layer 113, an interlayer insulating layer 114, a passivation layer 115, a planarization layer 116, a bank 117, and an encapsulation unit 118.

The lower substrate 110 may be formed of plastic polymer material such as polyimide (PI). On the lower substrate 110, a plurality of switching transistors ST and a driving transistor DT related to the driving of the organic light emitting diode OLED.

The lower substrate 110 may be attached onto an auxiliary substrate. The auxiliary substrate may be configured by a glass substrate and a sacrificial layer. The auxiliary substrate may be separated from the lower substrate 110 on which an organic light emitting diode is formed, by a laser release process.

Further, the lower substrate 110 may include a display area and a non-display area. In the display area, a plurality of pixel areas is disposed in a matrix manner. In the pixel area, display elements for a displaying function are disposed. The non-display area may be disposed in the vicinity of the display area and driving elements for driving display elements formed in the pixel area may be disposed therein. Further, a part of the non-display area of the lower substrate 110 may be bent if necessary.

The display area may be divided into a first area and a second area which is spaced apart from the first area. The pixel 1 of the organic light emitting display device according to the exemplary embodiment of the present disclosure includes a first thin film transistor disposed in the first area and a second thin film transistor disposed in the second area, on the lower substrate 110. The first thin film transistor may be the LTPS thin film transistor 130 and the second thin film transistor may be the oxide semiconductor thin film transistor 140. Specifically, when a plurality of thin film transistors is included in a unit pixel area, the first thin film transistor and the second thin film transistor may be disposed to be adjacent to each other. Specifically, the first thin film transistor including a polycrystalline semiconductor material may be applied to the driving thin film transistor and the second thin film transistor including the oxide semiconductor material may be applied to the switching thin film transistor.

Further, the first thin film transistor is a thin film transistor for a gate driving element formed in the non-display area and the second thin film transistor may be a thin film transistor for a display element disposed in the pixel area of the display area. Further, when the gate driving element is formed in the non-display area, the gate driving element may be implemented by a C-MOS type thin film transistor including the polycrystalline silicon LTPS layer. That is, both a P-MOS type thin film transistor and a N-MOS type thin film transistor including the polycrystalline silicon LTPS layer are formed in a gate driver in the non-display area. In this case, for the N-MOS type, a plurality of mask process for forming a low density doping area is required. Here, the gate driving element may be configured by a hetero thin film transistor in which the N-MOS type thin film transistor including the polycrystalline silicon LTPS layer is replaced with a thin film transistor including an oxide semiconductor layer. By doing this, the low density doping area may be avoided, so that it is advantageous in that the number of mask processes may be reduced.

As described above, the substrate including the hetero thin film transistor may be applied to the organic light emitting display device. For example, in the case of the organic light emitting display device, the second thin film transistor may be a switching thin film transistor which selects a pixel and the first thin film transistor may be a driving thin film transistor which drives the selected pixel. In some cases, the second thin transistor and the first thin film transistor may be configured in an opposite manner.

Next, the buffer layer 111 is formed on the entire surface of the lower substrate 110.

That is, the buffer layer 111 can be entirely formed over the display area and the non-display area of the lower substrate 110. The buffer layer 111 may have a structure in which a plurality of thin films is deposited. Here, it is described that the buffer layer 111 is a single layer for the convenience of description. Silicon oxide (SiOx) which does not specifically affect the elements may be used for the buffer layer 111.

Further, as illustrated in FIG. 2, a groove may be formed in a part of the buffer layer 111 located in the non-display area to minimize cracks or other irregularities which may be caused during the bending.

Next, the BSM 120 is selectively formed only in a necessary area on the buffer layer 111. Further, the BSM 120 may be formed using molybdenum (Mo) material. The BSM 120 is located on the buffer layer 111 to overlap the LTPS thin film transistor 130 which is a driving thin film transistor of the pixel 1.

The BSM 120 may fundamentally block a potential from generating on the surface of the lower substrate 110 and light which is incident from the outside.

More specifically, in the pixel 1 according to the exemplary embodiment of the present disclosure, the active layers of various transistors including the driving transistor DT may be damaged due to the laser release process. Further, a negative charge trap is generated on the sacrificial layer due to laser and light incident from the outside and thus positive (+) charges may move from polyimide PI which forms the lower substrate 110 toward the sacrificial layer. By doing this, the potential on the surface of the lower substrate 110 may be increased. As a result, current which flows through the transistor may be reduced.

Further, when the LTPS thin film transistor 130 is turned off, a source electrode 133 of the LTPS thin film transistor 130 which is connected to the organic light emitting diode OLED is maintained to be floated. In this case, as the potential of the surface of the lower substrate 110 is increased, a parasitic capacitance may be generated between the lower substrate 110 and the source electrode 133 of the LTPS thin film transistor 130. The source electrode 133 may be consistently affected by the parasitic capacitance. Therefore, the current which flows through the source electrode of the LTPS thin film transistor 130 may be changed by the parasitic capacitance, so that a residual-image may be generated even at the time of restoration.

Further, after performing the laser release process, when the pixel 1 of the organic light emitting display device 100 including the lower substrate 110 which is formed of a plastic polymer material such as polyimide (PI) is driven, heat may be generated in the lower substrate 110. As a result, charged particles generated in the lower substrate 110 may upwardly move. The charged particles affect the active layers of the thin film transistors, which may lower reliability of the organic light emitting display device 100.

Therefore, as illustrated in FIG. 2, the BSM 120 is electrically connected to the source electrode 133 of the LTPS thin film transistor 130 to minimize influence of the charges flowing through a channel of the thin film transistor which drives the pixel 1. As a result, a current drop phenomenon in which the driving current of the thin fl' 1 transistor is lowered, restoration residual image problem and reliability of the OLED display device 100 may be solved.

Next, an active buffer layer 112 which encloses the BSM 120 and protects the active layer of the LTPS thin film transistor 130 is located on the buffer layer 111. The active buffer layer 112 is formed only in the display area of the lower substrate 110. The active buffer layer 112 may be formed of the same material as the buffer layer 111.

Next, the LTPS thin film transistor 130 is located on the active buffer layer 112. The LTPS thin film transistor 130 may be configured by an active layer 131, a gate electrode 132, the source electrode 133, and a drain electrode 134.

The active layer 131 of the LTPS thin film transistor 130 is formed of a polycrystalline silicon LTPS material. The LTPS material has a high mobility (100 $cm^2/Vs$ or higher), so that energy power consumption is lower and reliability is excellent. Therefore, the LTPS material may be applied to a gate driver for a driving element driving thin film transistors for a display element and/or a multiplexer (MUX). Alternatively, the LTPS material may be applied to the driving thin film transistor in the pixel in the organic light emitting display device 100. When the semiconductor layer is formed of the LTPS material, an impurity injecting process and a high temperature heat treatment process are required. In contrast, when the semiconductor layer is formed of an oxide semiconductor material, the process is performed at a relatively low temperature. Accordingly, it is desirable that after forming the LTPS layer in which the process is performed under a severe condition, the oxide semiconductor layer is formed later. Further, for the simplification of the manufacturing process, it is desirable that components of the LTPS thin film transistor 130 including the LTPS layer and the oxide semiconductor thin film transistor 140 including the oxide semiconductor layer are formed on the same layer. For example, it is desirable that the gate electrode 132 of the LTPS thin film transistor 130 and the gate electrode 142 of the oxide semiconductor thin film transistor 140 are formed of the same metal material on the same layer and the source-drain electrode of each thin film transistor is formed of the same metal material on the same layer. Specifically, in order to secure the characteristic of the semiconductor element, it is desirable to form the LTPS thin film transistor to have a top-gate structure which precisely defines a channel area.

The active layer 131 is formed on a top surface of the active buffer layer 112. The active layer 131 includes a channel area CA of the LTPS thin film transistor 130. The channel area CA is defined as an area where the gate electrode 132 and the active layer 131 overlap each other. Since the gate electrode 132 overlaps a central part of the LTPS thin film transistor 130, the central part of the LTPS thin film transistor 130 serves as a channel area CA. Both sides of the channel area CA are doped with impurities and are defined as a source area SA and a drain area DA.

A doping area including the source area SA and the drain area DA is defined by injecting impurities. Each of the source area SA and the drain area DA may include a high density doping area HDD and a low density doping area LDD.

Further, the active layer 131 is formed by performing low-temperature crystallization on a polycrystalline semiconductor material such as polysilicon. When the LTPS thin film transistor 130 is the driving thin film transistor DT, the LTPS thin film transistor may have a characteristic suitable for performing a high speed driving process. For example, a P-MOS or N-MOS type thin film transistor may be used or a C-MOS type thin film transistor including both the P-MOS and N-MOS thin film transistors may be provided. The P-MOS, the N-MOS and/or the C-MOS type thin film transistors may include a polycrystalline semiconductor material such as polycrystalline silicon (poly-silicon).

Further, the gate electrode 132 is formed to overlap the channel area CA of the active layer 131. As a result, the LTPS thin film transistor 130 may have a top-gate structure.

Further, as illustrated in FIG. 2, the source electrode 133 of the LTPS thin film transistor 130 is in contact with the doping area of the active layer 131 and is electrically connected to the organic light emitting diode 160. Further, the source electrode 133 may be electrically connected to the BSM 120. The drain electrode 134 of the LTPS thin film transistor 130 is electrically connected to the source electrode of the oxide semiconductor thin film transistor 140.

Next, the gate insulating layer 113 of the LTPS thin film transistor 130 is formed on the active layer 131 of the LTPS thin film transistor 130 in the display area of the lower substrate 110. The gate insulating layer 113 may be formed of silicon nitride SiNx or silicon oxide SiOx. In consideration of stability and characteristic of the elements, the gate insulating layer 113 may have a thickness of approximately 1000 Å to 1500 Å. When the gate insulating layer 113 is formed of silicon nitride SiNx, a large amount of hydrogen may be contained in the gate insulating layer 113 due to the manufacturing process. The hydrogen may diffused to the outside of the gate insulating layer 113 in the subsequent process so that the gate insulating layer 113 may be formed of a silicon oxide (SiOx) material.

Next, the oxide semiconductor thin film transistor 140 is located on the gate insulating layer 113 in the display area of the lower substrate 110. The oxide semiconductor thin film transistor 140 may be configured by an active layer 141, a gate electrode 142, a source electrode 143, and a drain electrode 144.

Further, as illustrated in FIG. 2, the gate electrode 142 of the oxide semiconductor thin film transistor 140 is formed on the gate insulating layer 113.

The active layer 141 of the oxide semiconductor thin film transistor 140 is formed of an oxide semiconductor material. For example, the oxide semiconductor material such as indium gallium zinc oxide (IGZO), indium gallium oxide (IGO), and indium zinc oxide (IZO) may be included. The oxide semiconductor material has a low off-current characteristic so that a voltage maintain period of the pixel is long. Therefore, the oxide semiconductor material is suitable for a display device which requires low speed driving and low power consumption. When the oxide semiconductor material is contained, in consideration of a structure in which different types of thin film transistors according to the exemplary embodiment of the present disclosure are included on one substrate, the active layer may have a bottom gate structure which may more efficiently secure the stability of the element.

The active layer 141 of the oxide semiconductor thin film transistor 140 is located on the gate electrode 142. The source electrode 143 and the drain electrode 144 of the oxide semiconductor thin film transistor 140 are in electrically contact with the active layer 141. Further, the source electrode 143 is connected to the drain electrode 134 of the LTPS thin film transistor 130.

Further, the signal line 170 may be formed of the same material as the source electrode 143 and the drain electrode 144 of the oxide semiconductor thin film transistor in the non-display area of the lower substrate 110.

Further, the gate electrode 142 of the oxide semiconductor thin film transistor 140 is simultaneously formed of the same material as the gate electrode 132 of the LTPS thin film transistor 130 on the same plane. Further, the gate electrode 142 of the oxide semiconductor thin film transistor 140 may be formed of the same material as the BSM 120.

Next, the interlayer insulating layer 114 is located on the gate electrode 132 of the LTPS thin film transistor 130 and the gate electrode 142 of the oxide semiconductor thin film transistor 140, in the display area of the lower substrate 110. The interlayer insulating layer 114 may have a dual layered structure in which a nitride film SIN including silicon nitride SiNx and an oxide film SIO including silicon oxide SiOx are sequentially deposited. The interlayer insulating layer 114 is formed prior to a subsequent heat treatment process of an activating process and a hydrogenating process on the active layer 131 of the LTPS thin film transistor 130.

The nitride film SIN of the interlayer insulating layer 114 diffuses hydrogen contained therein through the subsequent heat treatment process to be deposited to perform the hydrogenating process on the active layer 131 of the LTPS thin film transistor 130 containing the polycrystalline silicon. The hydrogenating process refers to a process in which incompletely coupled spaces are filled with hydrogen through the activating process on the active layer 131 of the LTPS thin film transistor 130.

In contrast, the oxidation film SIO of the interlayer insulating layer 114 is deposited in order to suppress hydrogen discharged from the nitride film SIN by the subsequent heat treatment process from being excessively diffused to the semiconductor material of the oxide semiconductor thin film transistor 140, that is, the active layer 141.

For example, the hydrogen discharged from the nitride film SIN of the interlayer insulating layer 114 may be diffused to the active layer 131 of the LTPS thin film transistor 130 disposed with the gate insulating layer 113 therebetween. Therefore, the nitride film SIN may be deposited directly on the gate insulating layer 113. Accordingly, the oxide film SIO may be preferably deposited on the nitride film SIN. In consideration of the manufacturing process, the entire thickness of the interlayer insulating layer 114 may be 2000 Å to 6000 Å. Therefore, each thickness of the nitride film SIN and the oxide film SIO may be 1000 Å to 3000 Å. Further, a large amount of hydrogen in the nitride film SIN of the interlayer insulating layer 114 may be diffused to the active layer 141 of the oxide semiconductor thin film transistor 140. Specifically, the oxide film SIO of the interlayer insulating layer 114 is provided to adjust the diffusing degree of hydrogen which is discharged from the nitride film SIN so that the thickness of the oxide film SIO may be larger than that of the gate insulating layer 113.

Further, the oxide film SIO of the interlayer insulating layer 114 suppresses moving of hydrogen from the nitride film SIN containing a relatively large amount of hydrogen to the active layer 141 of the oxide semiconductor thin film transistor 141. When the hydrogen moves from the nitride film SIN to the active layer 141 of the oxide semiconductor thin film transistor 140, the active layer 141 of the oxide semiconductor thin film transistor 140 is reduced and a threshold voltage Vth of the oxide semiconductor thin film transistor 140 is changed.

Therefore, the interlayer insulating layer 114 having a dual layered structure in which the nitride film SIN including silicon nitride SiNx and the oxide film SIO including silicon oxide SiOx are sequentially deposited is disposed above the gate electrode 132 of the LTPS thin film transistor 130 and the gate electrode 142 of the oxide semiconductor thin film transistor 140.

Therefore, during the subsequent heat treatment process, movement of the hydrogen from the interlayer insulating layer 114 to the active layer 141 of the oxide semiconductor thin film transistor 140 may be suppressed.

Further, the oxide film SIO of the interlayer insulating layer 114 which is in directly contact with the active layer 141 of the oxide semiconductor thin film transistor 140 is formed of silicon oxide SiOx having a low hydrogen content. Therefore, the influence due to hydrogen may be reduced as compared with a case in which the insulating layer which is formed of silicon nitride SiNX is in directly contact with the active layer 141 of the oxide semiconductor thin film transistor 140.

Specifically, when an activating process and hydrogenating process on the active layer 131 of the LTPS thin film transistor 130 are not performed immediately after forming the interlayer insulating layer 114, but performed after forming the active layer 141 of the oxide semiconductor thin film transistor 140, more hydrogen may move from the interlayer insulating layer 114 to the active layer 141 of the oxide semiconductor thin film transistor 140 due to the high temperature which is applied at the time of the activating process and the hydrogenating process.

Therefore, in the organic light emitting display device 100 according to the exemplary embodiment of the present disclosure, the interlayer insulating layer 114 having a dual layered structure in which the nitride film SIN including silicon nitride SiNx and the oxide film SIO including silicon oxide SiOx are sequentially deposited is used to reduce the diffusion of the hydrogen to the active layer 141 of the oxide semiconductor thin film transistor 140.

Accordingly, the reduction of the active layer 141 of the oxide semiconductor thin film transistor 140 is minimized and the change of the threshold voltage Vth of the oxide semiconductor thin film transistor 140 may be minimized.

Further, a contact hole may be formed in the gate insulating layer 113 and the interlayer insulating layer 114 to expose the source area SA and the drain area DA of the active layer 131 of the LTPS thin film transistor 130.

Next, the passivation layer 115 is entirely formed over the display area and the non-display area of the lower substrate 110.

Further, the passivation layer 115 is located on a top surface of the interlayer insulating layer 114 and is formed to cover the LTPS thin film transistor 130 and the oxide semiconductor thin film transistor 140 to be served as a protection layer. The passivation layer 115 may cover the signal line 170 with a patterned shape to minimize the generation of a crack in the non-display area of the lower substrate 110 at the time of bending.

The dummy metal pattern 150 is located on the top surface of the passivation layer 115. The dummy metal pattern 150 is configured by a storage capacitor electrode 151 which generates a storage capacitor Cst together with the source electrode 133 of the LTPS thin film transistor 130 and the dummy electrode 152 which serves as a second gate electrode of the oxide semiconductor thin film transistor 140. The dummy metal pattern 150 may be formed of the same material as the source electrode 133 of the LTPS thin film transistor 130.

The storage capacitor electrode 151 overlaps the source electrode 133 of the LTPS thin film transistor 130 and located with a large area. Further, the dummy metal pattern 150 generates a storage capacitor Cst together with the source electrode 133. The storage capacitor Cst may increase a capacity of the storage capacitor Cst using the storage capacitor electrode 151 with a large area so that the storage capacitor may be utilized for an organic light emitting display device which requires a high resolution.

The dummy electrode 152 is located above the oxide semiconductor thin film transistor 140. Further, the dummy electrode 152 is connected to the gate electrode 142 of the oxide semiconductor thin film transistor 140 through a contact metal pattern to be served as a second gate electrode of the oxide semiconductor thin film transistor 140. Therefore, the dummy electrode 152 may serve to shield the external light which is incident on the channel of the oxide semiconductor thin film transistor 140, which is advantageous for a bias temperature stress which is applied to the oxide semiconductor thin film transistor 140 element due to the manufacturing process.

Next, the planarization layer 116 is disposed on the passivation layer 115 on which the dummy metal pattern 150 is formed.

In the case of the organic light emitting display device 100 according to the exemplary embodiment of the present disclosure, after completing the LTPS thin film transistor 130 and the oxide semiconductor thin film transistor 140, the organic light emitting diode 160 may be formed. The organic light emitting diode 160 includes the organic light emitting layer 162. The organic light emitting layer 162 is desirably formed on a flat surface by the planarization layer 116. The planarization layer 116 is disposed to planarize an upper surface of the lower substrate 110. The planarization layer 116 may include an organic insulating material and may be thickly applied with a thickness of 5000 Å or larger.

Next, the organic light emitting diode 160 is located on the top surface of the planarization layer 116. The organic light emitting diode 160 is configured by an anode electrode 161 which is a pixel electrode, the organic light emitting layer 162, and a cathode electrode 163.

The anode electrode 161 is electrically connected to the LTPS thin film transistor 130 which serves as a driving thin film transistor DT using a contact metal pattern among the dummy metal patterns 150.

A bank 117 is formed on the planarization layer 116 on which the anode electrode 161 is formed. The bank 117 has a structure which exposes an emission area on the anode electrode 161 and covers the remaining part. Therefore, when the organic light emitting layer 162 is formed on the planarization layer 116 on which the bank 117 is formed, the organic light emitting layer 162 may be laminated so as to be in directly surface-contact with the anode electrode 161 which is exposed in the emission area. Thereafter, the organic light emitting diode 160 in which the anode electrode 161, the organic light emitting layer 162, and the cathode electrode 163 are laminated in the emission area may be completed by laminating the cathode electrode 163 on the organic light emitting layer 162.

Next, the encapsulation unit 118 is formed on the organic light emitting diode 160. Further, the encapsulation unit 118 is also located on the non-display area of the lower substrate 110. The encapsulation unit 118 may serve to block undesirable foreign materials and moisture.

Finally, the signal line 170 is formed in the non-display area of the lower substrate 110. The signal line 170 may be formed of the same material as the source and drain electrodes 143 and 144 of the oxide semiconductor thin film transistor 140. Further, the signal line 170 is electrically connected to the gate driver 4 which transmits the driving signal to the pixel 1.

Figure 3:
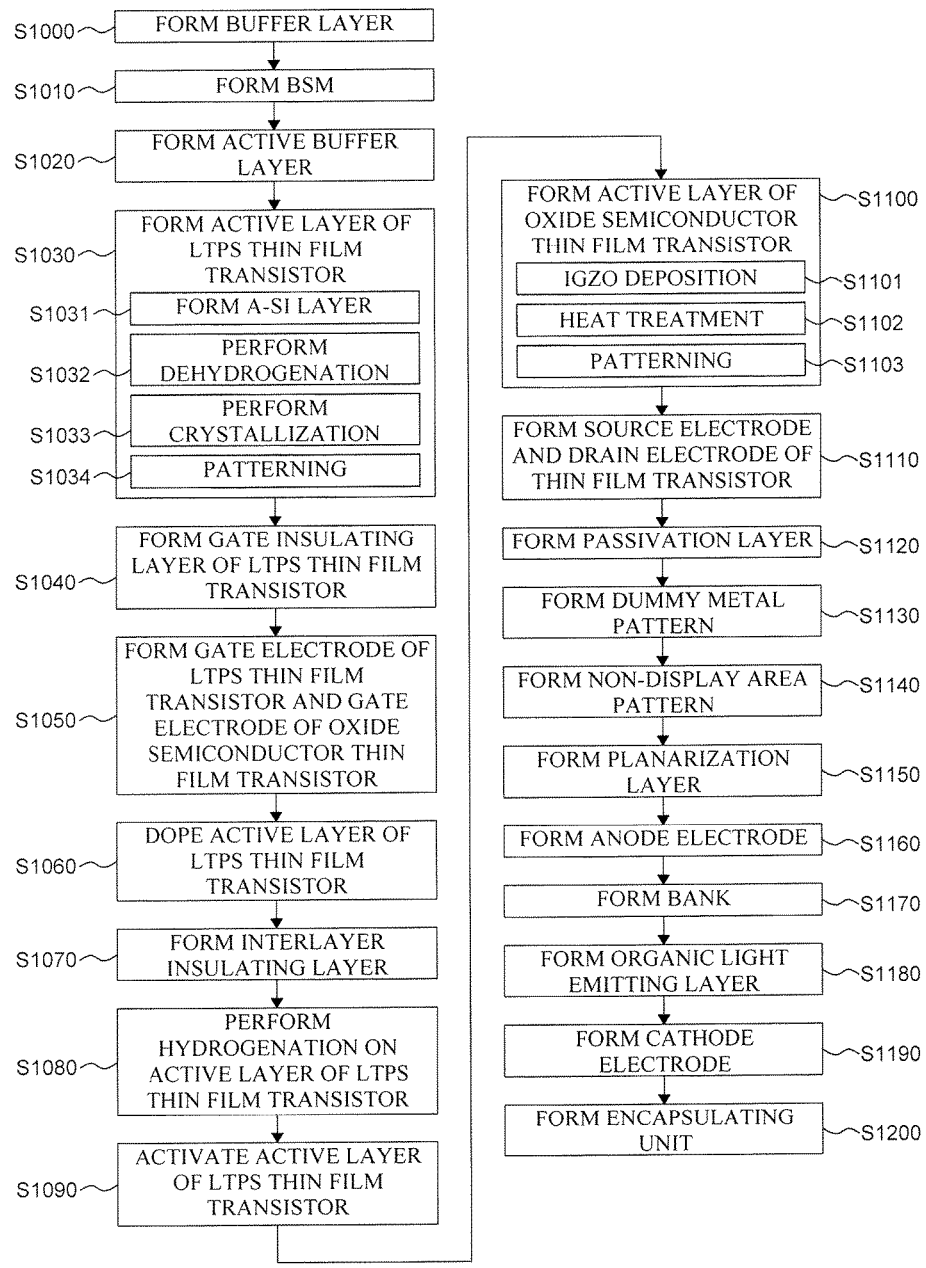
FIG. 3 is a flowchart illustrating a manufacturing process of a pixel illustrated in FIG. 1 according to an embodiment of the present disclosure.
Figure 4A:
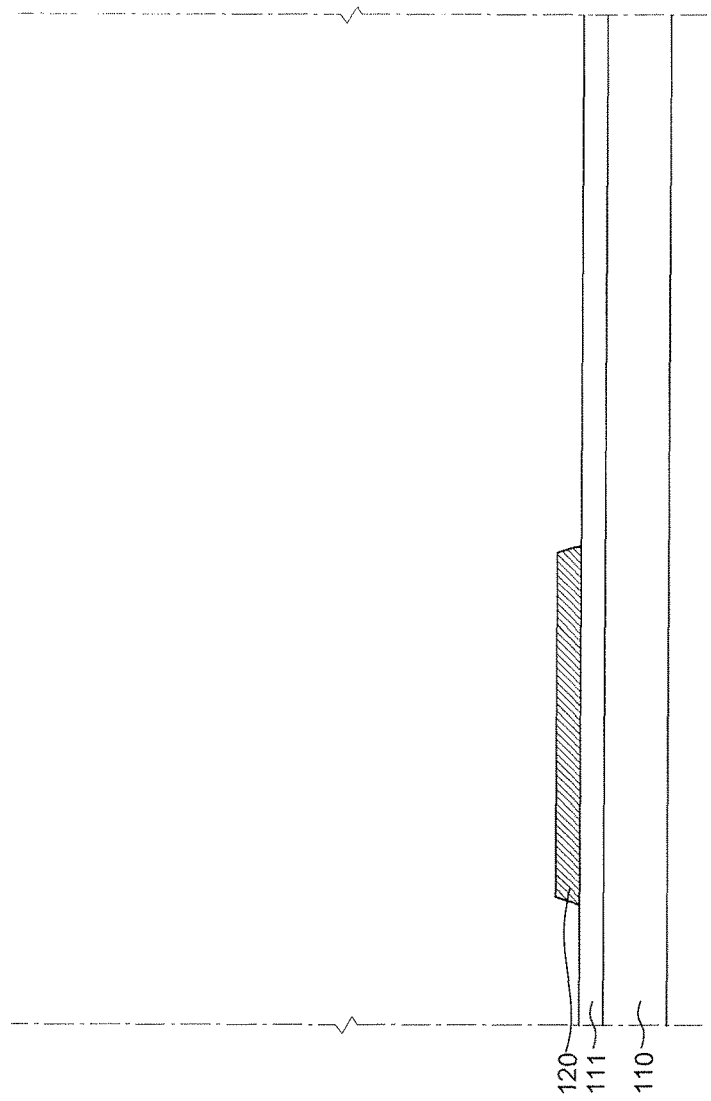
FIGS. 4A to 4C are cross-sectional views of a process for explaining a manufacturing process of a pixel illustrated in FIG. 1 according to an embodiment of the present disclosure.
Figure 4B:
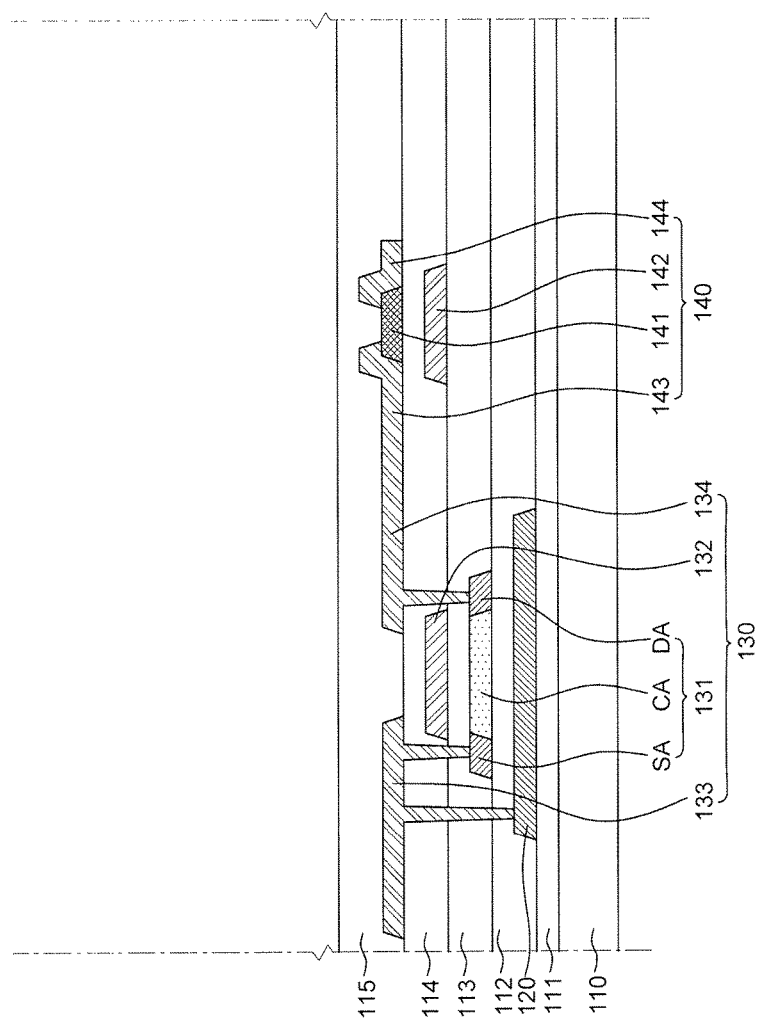
Figure 4C:
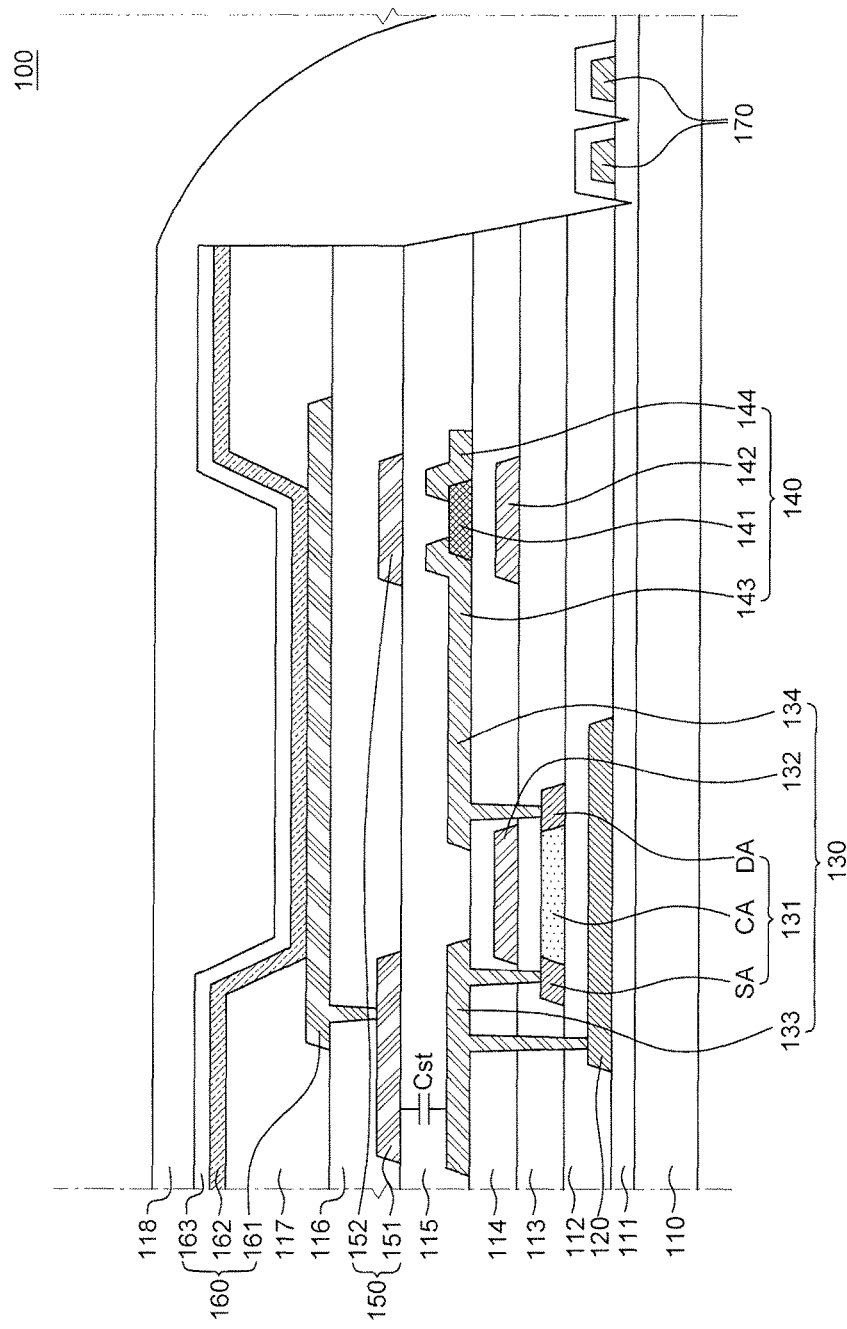

FIG. 3 is a schematic flowchart illustrating a manufacturing process of a pixel illustrated in FIG. 1 according to an exemplary embodiment of the present disclosure. FIGS. 4A to 4C are cross-sectional views of a process for explaining a manufacturing method of a pixel illustrated in FIG. 1 according to an exemplary embodiment of the present disclosure. For instance, FIG. 3 and FIGS. 4A to 4C are a flowchart and a cross-section view of a process for explaining a manufacturing method of the pixel 1 of the organic light emitting display device 100 illustrated in FIG. 2 and a redundant description will be omitted or may be brief.

Referring to FIG. 3, first, a buffer layer 111 is formed on a lower substrate 110 (S1000).

Referring to FIG. 4A, the buffer layer 111 is deposited on a surface of the lower substrate 110. Specifically, any one of silicon nitride SiNx and silicon oxide SiOx is deposited to form a single layered buffer layer 111 or silicon nitride SiNx and silicon oxide SiOx are alternately laminated to form a multiple layered buffer layer 111.

Next, a BSM 120 is formed on the surface of the buffer layer 111 (S1010).

Referring to FIG. 4A, the BSM 120 is deposited on the buffer layer 111. For example, the same material as the gate electrode 132 of the LTPS thin film transistor 130 is used to form a single layer BMS 120.

Next, an active buffer layer 112 is formed on the buffer layer 111 (S1020).

Referring to FIG. 4B, the active buffer layer 112 is deposited on the surface of the buffer layer 111 so as to cover the BSM 120. Specifically, any one of silicon nitride SiNx and silicon oxide SiOx is deposited to form a single layered active buffer layer 112 or silicon nitride SiNx and silicon oxide SiOx are alternately laminated to form a multiple layered active buffer layer 111.

Next, the active layer 131 of the LTPS thin film transistor 130 is formed on the active buffer layer 112 (S1030).

Referring to FIG. 4B, an amorphous silicon (a-Si) is deposited on the surface of the active buffer layer 112 to form an a-Si layer (S1031), and perform dehydrating process on an a-Si layer (S1032). When there is a large amount of hydrogen in the a-Si layer, such hydrogen may create adverse effects during the subsequent crystalizing process (S1033), and thus cause failures. Therefore, the dehydrogenating step (S1032) is a process which removes the hydrogen from the a-Si layer and is carried out before performing the crystalizing process S1033 after forming the a-Si layer.

Next, referring to FIG. 3, after completing the dehydrogenating process S1032, a crystalizing process is performed on the a-Si layer (S1033).

The crystalizing process is a process which forms polysilicon by crystalizing the amorphous silicon (a-Si) of the a-Si layer, for example, may be performed by an excimer laser annealing (ELA) process.

Next, the p-Si layer on which the crystallization is completed is patterned to form the active layer 131 of the LTPS thin film transistor 130 (S1034).

Next, the gate insulating layer 113 of the LTPS thin film transistor 130 is formed (S1040) and the gate electrode 132 of the LTPS thin film transistor 130 and the gate electrode 142 of the oxide semiconductor thin film transistor 140 are formed (S1050).

Referring to FIG. 4B, the gate insulating layer 113 is formed on the active layer 131 of the LTPS thin film transistor 130. Specifically, the gate insulating layer 113 may be formed of silicon nitride SiNx or silicon oxide SiOx. In consideration of stability and characteristic of the elements, the gate insulating layer 113 may have a thickness of approximately 1000 Å to 1500 Å. When the gate insulating layer 113 is formed of silicon nitride SiNx, a large amount of hydrogen may be contained in the gate insulating layer 113 due to the manufacturing process. The hydrogen may diffuse to the outside of the gate insulating layer 113 in the subsequent process so that the gate insulating layer 113 may be formed of a silicon oxide (SiOx) material.

Next, the gate electrode 132 of the LTPS thin film transistor 130 and the gate electrode 142 of the oxide semiconductor thin film transistor 140 are formed by depositing a material for a gate electrode on the gate insulating layer 113 and patterning the material for a gate electrode (S1050).

The material for a gate electrode may be various metal materials such as molybdenum (Mo).

Next, a doping process is performed on the active layer 131 of the LTPS thin film transistor with the gate electrode 132 of the LTPS thin film transistor 130 as a mask (S1060).

Referring to FIG. 4B, impurities are injected onto the active layer 131 of the LTPS thin film transistor 130 which is disposed at a lower portion using the gate electrode 132 of the LTPS thin film transistor 130 as a mask to define the source area SA and the drain area DA of the active layer 131 of the LTPS thin film transistor 130, that is, a doping area. The process of defining the doping area may vary by the P-MOS thin film transistor, the N-MOS thin film transistor, or the C-MOS thin film transistor.

For example, in the case of the N-MOS thin film transistor, the high density doping area is formed first and then the low density doping area may be formed. Specifically, the high density doping area is defined using a photoresist which is larger than the gate electrode 132 of the LTPS thin film transistor 130 and then the photoresist is removed. Further, the low density doping area LDD may be defined with the gate electrode 132 of the LTPS thin film transistor 130 as a mask.

In some exemplary embodiments, the doping area including the source area SA and the drain area DA may be defined before forming the gate insulating layer 113. Immediately after forming the active layer 131 of the LTPS thin film transistor 130, impurities may be doped using the photoresist.

Next, the interlayer insulating layer 114 is formed on the gate electrode 132 of the LTPS thin film transistor 130 and the gate electrode 142 of the oxide semiconductor thin film transistor 140 (S1070).

The interlayer insulating layer 114 is formed prior to a subsequent heat treatment process of an activating process and a hydrogenating process on the active layer 131 of the LTPS thin film transistor 130.

Referring to FIG. 4B, the interlayer insulating layer 114 may be formed to have a dual layered structure in which a nitride film SIN including silicon nitride SiNx and an oxide film SIO including silicon oxide SiOx are sequentially deposited.

The nitride film SIN of the interlayer insulating layer 114 diffuses hydrogen contained therein through the subsequent heat treatment process to be deposited to perform the hydrogenating process on the active layer 131 of the thin film transistor 130 containing the polycrystalline silicon.

In contrast, the oxidation film SIO of the interlayer insulating layer 114 is deposited in order to suppress hydrogen discharged from the nitride film SIN by the subsequent heat treatment process from being excessively diffused to the semiconductor material of the oxide semiconductor thin film transistor 140.

Next, the activating process is performed on the active layer 131 of the LTPS thin film transistor 130 (S1080) and the hydrogenating process is performed on the active layer 131 of the LTPS thin film transistor 130 (S1090).

First, the activating process on the active layer 131 of the LTPS thin film transistor 130 will be described. As a result of the doping process on the active layer 131 of the LTPS thin film transistor 130, the injected impurities (dopants) are present at random. Therefore, the activating process on the active layer 131 of the LTPS thin film transistor 130 is a process for placing the impurities in the silicon (Si) lattice. Further, since the doping process on the active layer 131 of the LTPS thin film transistor 130 is a process of artificially injecting the impurities in the active layer, as a result of the doping process on the active layer 131 of the LTPS thin film transistor 130, the silicon Si may be damaged. Therefore, the activating process on the active layer 131 of the LTPS thin film transistor 130 is performed to cure the damage of the silicon Si.

Next, the hydrogenating process on the active layer 131 of the LTPS thin film transistor 130 will be described. The presence of vacancy in the polysilicon may degrade the characteristic of the polysilicon. Therefore, the hydrogenating process on the active layer 131 of the LTPS thin film transistor 130 is a process for filling vacancies of the polysilicon with hydrogen. The hydrogenating process on the active layer 131 of the LTPS thin film transistor 130 is performed by diffusing hydrogen included in the interlayer insulating layer 150 of the LTPS thin film transistor 130 by the heat treatment process. For example, the hydrogenating process may be performed through the heat treatment process at approximately 350° C. to 380° C. The active layer 131 of the LTPS thin film transistor 130 may be stabilized by the above-described hydrogenating process on the active layer 131 of the LTPS thin film transistor 130.

Next, the active layer 141 of the oxide semiconductor thin film transistor 140 is formed on the interlayer insulating layer 114 (S1100).

Referring to FIG. 3, a metal oxide, for example, IGZO is deposited on the interlayer insulating layer 114 to form an IGZO layer. In FIG. 3, it is described that the IGZO layer 1292 is formed under an assumption that the active layer 141 of the oxide semiconductor thin film transistor 140 is formed of IGZO among various metal oxides. However, the present disclosure is not limited thereto, but metal oxide other than IGZO may also be used.

The IGZO is deposited at a high temperature. Therefore, the IGZO may be crystalized during the IGZO deposition process. When the IGZO is deposited at a room temperature, the IGZO may be amorphous. However, when the IGZO is deposited at a high temperature, a layered structure of indium (In), gallium (Ga), and zinc (Zn) is formed to form a network. Further, as the crystallization is performed at the high temperature, oxygen vacancies are reduced in the IGZO layer. When there are many oxygen vacancies in the IGZO layer, a tunneling phenomenon is generated and thus the IGZO layer becomes conductive. Therefore, the BTS characteristic of the oxide semiconductor thin film transistor 140 are improved and the reliability is increased as the crystallization is performed a high temperature at the time of the IGZO deposition.

Next, the IGZO layer is thermally processed to stabilize the IGZO layer (S1102) and as illustrated in FIG. 4B, the IGZO layer is patterned (S1103) to form the active layer 141 of the oxide thin film transistor 140.

Next, the source electrode 133 and the drain electrode 134 of the LTPS thin film transistor 130 and the source electrode 143 and the drain electrode 144 of the oxide semiconductor thin film transistor 140 are formed (S1110).

As illustrated in FIG. 4B, the source electrode 133 of the LTPS thin film transistor 130 is electrically connected to the BSM 120 through the contact holes of the interlayer insulating layer 114, the gate insulating layer 113, and the active buffer layer 112. Further, when the source electrode 133 and the drain electrode 134 of the LTPS thin film transistor 130 and the source electrode 143 and the drain electrode 144 of the oxide semiconductor thin film transistor 140 are formed, a signal line 170 is formed of the same material as the source electrode and the drain electrode in the non-display area of the lower substrate 110.

Referring to FIG. 4B, the source electrode 133 and the drain electrode 134 of the LTPS thin film transistor 130 and the source electrode 143 and the drain electrode 144 of the oxide semiconductor thin film transistor 140 are formed by depositing and patterning a material for the source electrode and the drain electrode on the gate insulating layer 114 and the active layer 141 of the oxide semiconductor thin film transistor 140. In this case, the source electrode 133 and the drain electrode 134 of the LTPS thin film transistor 130 and the source electrode 143 and the drain electrode 144 of the oxide semiconductor thin film transistor 140 are formed of a triple layered structure of titanium (Ti)/aluminum (Al)/titanium (Ti) so that the patterning process may be performed by dry etching. Further, by the patterning process of the source electrode 143 and the drain electrode 144, a groove is formed in a part of the buffer layer 111 formed in the non-display area of the lower substrate 110 and the remaining insulating layers are removed.

In some exemplary embodiment, in order to suppress the damage of the active layer 141 of the oxide semiconductor thin film transistor 140, two steps of dry etching are applied to perform a primary dry etching at a high etching rate and perform a secondary dry etching at a low etching rate. Therefore, the damage of the active layer 141 of the oxide semiconductor thin film transistor 140 may be reduced.

Next, a passivation layer 115 is formed to cover the LTPS thin film transistor 130 and the oxide semiconductor thin film transistor 140 (S1120).

The passivation layer 115 may be formed of silicon nitride SiNx or silicon oxide SiOx. Next, the passivation layer 115 is entirely formed over the display area and the non-display area of the lower substrate 110. Specifically, the passivation layer 115 formed in the non-display area encloses the signal line 170. It is considered that the passivation layer 115 protects the signal line 170.

Next, the dummy metal pattern 150 is formed on a surface of the passivation layer 115 (S1130).

Referring to FIG. 4C, the dummy metal pattern 150 is configured by a storage capacitor electrode 151 which generates a storage capacitor Cst together with the source electrode 133 of the LTPS thin film transistor 130 and the dummy electrode 152 which serves as a second gate electrode of the oxide semiconductor thin film transistor 140. The dummy metal pattern 150 may be formed of the same material as the source electrode 133 of the LTPS thin film transistor 130.

Next, when the dummy metal pattern 150 is formed by dry etching, the passivation layer 115 which is formed in the non-display area of the lower substrate 110 is also patterned (S1140).

As a result, when a part of the non-display area is bent, the crack generation may be minimized.

Next, a planarization layer 116 is formed on the passivation layer 115 and the dummy metal pattern 150 (S1150) and the anode electrode 161 of the organic light emitting diode 160 is formed on the planarization layer 116 (S1160). The bank 117 is formed on the planarization layer 116 and the anode electrode 161 (S1170), the organic light emitting layer 162 is formed on the top surface of the anode electrode (S1180), and the cathode electrode 163 is formed on the top surface of the organic light emitting layer (S1190).

Referring to FIG. 4C, the planarization layer 116 which is formed in the non-display area is removed at the time of the process of patterning the organic light emitting diode 160.

Finally, an encapsulation unit 190 is formed on the organic light emitting diode (S1200).

Some of the features of the embodiment(s) of the present disclosure can be described as follows.

According to an aspect of the present disclosure, the dummy electrode of the organic light emitting display device according to an exemplary embodiment of the present disclosure is connected to the second gate electrode using a contact metal pattern which is formed of the same material as the second source electrode and is located on the same plane as the second source electrode.

The organic light emitting display device may further include a lower protective metal pattern on the first buffer layer. The lower protective metal pattern is disposed to overlap the driving transistor.

The lower protective metal pattern of the organic light emitting display device may be electrically connected to the first source electrode to minimize a current drop of the driving transistor.

The organic light emitting display device may further include a second buffer layer on the lower protective metal pattern in the display area of the organic light emitting display device.

The organic light emitting display device may further include a signal line unit formed of the same material as the first source electrode and on the same plane as the first source electrode in the non-display area.

The organic light emitting display device may further include a passivation layer to cover the driving transistor and the switching transistor.

A capacitor electrode and a dummy electrode are located on the passivation layer of the organic light emitting display device.

The passivation layer of the organic light emitting display device is formed over the display area and the non-display area.

The passivation layer of the organic light emitting display device has a pattern shape which minimizes cracks generated in the non-display area at the time of bending.

The first buffer layer of the organic light emitting display device has a groove in a partial area of the non-display area.

The flexible substrate of the organic light emitting display device can be made of polyimide.

The first gate electrode and the second gate electrode of the organic light emitting display device are simultaneously formed on the same plane.

The second gate electrode and the dummy electrode of the organic light emitting display device shield external light which is incident onto the upper portion and the lower portion of the channel of the switching transistor.

The dummy electrode of the organic light emitting display device may minimize a bias temperature stress (BTS) of the switching transistor.

The organic light emitting display device may further include a gate driving thin film transistor which is located in the non-display area of the organic light emitting display device and is electrically connected to a part of the signal line unit.

The gate driving thin film transistor of the organic light emitting display device has the polycrystalline silicon (LTPS) layer as an active layer.

The organic light emitting display device may further include a gate insulating layer which insulates a polycrystalline silicon (LTPS) layer of the driving transistor and the first gate electrode from each other.

The organic light emitting display device may further include an interlayer insulating layer on a top surface of the gate insulating layer. The interlayer insulating layer is configured to cover the first gate electrode and the second gate electrode.

The interlayer insulating layer of the organic light emitting display device may have a dual layered structure in which a nitride film SIN including silicon nitride SiNx and an oxide film SIO including silicon oxide SiOx are sequentially deposited.

The oxide film SIO of the organic light emitting display device may minimize hydrogen which is discharged from the nitride film SIN due to a subsequent heat treatment process from being diffused to the oxide semiconductor layer of the switching transistor.

The exemplary embodiments of the present disclosure have been described with reference to the accompanying drawings, but those skilled in the art will understand that the present disclosure may be implemented in other specific forms without changing the technical scope thereof. Thus, it is to be appreciated that embodiments described above are intended to be illustrative in every sense, and not restrictive. Further, the scope of the present disclosure may be indicated by the following claims rather than the above detailed description. It should be interpreted that all changes or modifications deducted from the meaning and the scope of the claims and the equivalent concepts thereof are included in the scope of the present disclosure.

What is claimed is:

1. An organic light emitting display device, comprising:
a flexible substrate including a display area and a non-display area;
a first buffer layer over an entire surface of the flexible substrate;
a driving transistor on the first buffer layer in the display area, the driving transistor including a polycrystalline silicon (LTPS) layer, a first gate electrode, a first source electrode, and a first drain electrode;
a capacitor electrode on the first source electrode of the driving transistor, the capacitor electrode forming a storage capacitor together with the first source electrode;
a switching transistor in the display area to be spaced apart from the driving transistor, the switching transistor including an oxide semiconductor layer, a second gate electrode, a second source electrode, and a second drain electrode;
a dummy electrode on the switching transistor, the dummy electrode formed of the same material as the capacitor electrode, disposed on the same plane as the capacitor,- and functioning as a third gate electrode of the switching transistor; and
a passivation layer covering the driving transistor and the switching transistor,
wherein the capacitor electrode and the dummy electrode are located on the passivation layer.

2. The organic light emitting display device according to claim 1, wherein the dummy electrode is connected to the second gate electrode through a contact metal pattern, the contact metal pattern formed of the same material as the second source electrode and located on the same plane as the second source electrode.

3. The organic light emitting display device according to claim 1, further comprising:
a lower protective metal pattern on the first buffer layer and disposed to overlap the driving transistor.

4. The organic light emitting display device according to claim 3, wherein the lower protective metal pattern is electrically connected to the first source electrode to minimize a current drop of the driving transistor.

5. The organic light emitting display device according to claim 3, further comprising:
a second buffer layer on the lower protective metal pattern in the display area.

6. The organic light emitting display device according to claim 1, further comprising:
a signal line unit formed of the same material as the first source electrode and on the same plane as the first source electrode in the non-display area.

7. The organic light emitting display device according to claim 6, further comprising:
a gate driving thin film transistor in the non-display area, the gate driving thin film transistor electrically connected to a part of the signal line unit.

8. The organic light emitting display device according to claim 7, wherein the gate driving thin film transistor has the polycrystalline silicon (LTPS) layer as an active layer.

9. The organic light emitting display device according to claim 1, wherein the passivation layer is formed over the display area and the non-display area.

10. The organic light emitting display device according to claim 9, wherein the passivation layer has a pattern shape which minimizes cracks generated in the non-display area when the non-display area is bent.

11. The organic light emitting display device according to claim 1, wherein the first buffer layer has a groove in a partial area of the non-display area.

12. The organic light emitting display device according to claim 1, wherein the flexible substrate is formed of polyimide.

13. The organic light emitting display device according to claim 1, wherein the first gate electrode and the second gate electrode are formed on the same plane as a result of the same manufacturing process.

14. The organic light emitting display device according to claim 1, wherein the second gate electrode and the dummy electrode shield external light which is incident onto an upper portion and a lower portion of a channel of the switching transistor.

15. The organic light emitting display device according to claim 1, wherein the dummy electrode minimizes a bias temperature stress (BTS) of the switching transistor.

16. The organic light emitting display device according to claim 1, further comprising:
a gate insulating layer insulating the polycrystalline silicon (LTPS) layer and the first gate electrode from each other.

17. The organic light emitting display device according to claim 16, further comprising:
an interlayer insulating layer on a top surface of the gate insulating layer, the interlayer insulating layer covering the first gate electrode and the second gate electrode.

18. The organic light emitting display device according to claim 17, wherein the interlayer insulating layer has a dual layered structure in which a nitride film (SIN) including silicon nitride (SiNx) and an oxide film (SIO) including silicon oxide (SiOx) are sequentially deposited.

19. The organic light emitting display device according to claim 18, wherein the oxide film (SIO) minimizes hydrogen being diffused into the oxide semiconductor layer of the switching transistor which is discharged from the nitride film (SIN) due to a subsequent heat treatment process.

20. An organic light emitting display device, comprising:
a flexible substrate including a display area and a non-display area;
a driving transistor in the display area, the driving transistor having a polycrystalline silicon (LTPS) layer as an active layer;
a switching transistor in the display area, the switching transistor disposed to be spaced apart from the driving transistor;
a passivation layer covering the driving transistor and the switching transistor; and
a dummy metal pattern overlapping the driving transistor,
wherein the switching transistor includes:
a first gate electrode;
an oxide semiconductor layer overlapping the first gate electrode;
a first source electrode in contact with one side of the oxide semiconductor layer;
a first drain electrode in contact with another side of the oxide semiconductor layer; and
a second gate electrode connected to the first gate electrode, and
wherein the dummy metal pattern and the second gate electrode are located on the passivation layer.

21. The organic light emitting display device according to claim 20, wherein the driving transistor further includes a third gate electrode, a second source electrode, and a second drain electrode.

22. The organic light emitting display device according to claim 21, wherein the dummy metal pattern is formed of the same material as the second gate electrode and on the same plane as the second gate electrode, the dummy metal pattern being disposed to overlap the third gate electrode.

23. The organic light emitting display device according to claim 22, wherein the dummy metal pattern forms a storage capacitor together with the second source electrode.

* * * * *